(12) United States Patent
Dangelo et al.

(10) Patent No.: US 7,109,581 B2
(45) Date of Patent: Sep. 19, 2006

(54) SYSTEM AND METHOD USING SELF-ASSEMBLED NANO STRUCTURES IN THE DESIGN AND FABRICATION OF AN INTEGRATED CIRCUIT MICRO-COOLER

(75) Inventors: Carlos Dangelo, Los Gatos, CA (US); Meyya Meyyappan, San Jose, CA (US); Jun Li, Sunnyvale, CA (US)

(73) Assignee: Nanoconduction, Inc., Sunnyvale, CA (US)

( * ) Notice: Subject to any disclaimer, the term of this patent is extended or adjusted under 35 U.S.C. 154(b) by 63 days.

(21) Appl. No.: 10/925,824

(22) Filed: Aug. 24, 2004

(65) Prior Publication Data

US 2005/0046017 A1    Mar. 3, 2005

Related U.S. Application Data

(60) Provisional application No. 60/497,849, filed on Aug. 25, 2003.

(51) Int. Cl.
*H01L 23/34* (2006.01)

(52) U.S. Cl. .............................. 257/720; 257/E23.101; 257/E23.105; 438/122; 977/742; 977/762

(58) Field of Classification Search ...................... None
See application file for complete search history.

(56) References Cited

U.S. PATENT DOCUMENTS

| | | | |
|---|---|---|---|
| 5,818,700 A | 10/1998 | Purinton | |
| 5,837,081 A | 11/1998 | Ting et al. | |
| 5,965,267 A | 10/1999 | Nolan et al. | |
| 6,156,256 A | 12/2000 | Kennel | |
| 6,231,744 B1 | 5/2001 | Ying et al. | |
| 6,340,822 B1 | 1/2002 | Brown et al. | |
| 6,359,288 B1 | 3/2002 | Ying et al. | |
| 6,383,923 B1 | 5/2002 | Brown et al. | |
| 6,407,922 B1 | 6/2002 | Eckblad et al. | |
| 6,432,740 B1 | 8/2002 | Chen | |
| 6,504,292 B1 | 1/2003 | Choi et al. | |
| 6,713,151 B1 | 3/2004 | Dean et al. | |
| 6,800,886 B1 | 10/2004 | Awano | |
| 6,855,376 B1 | 2/2005 | Hwang et al. | |
| 6,856,016 B1 | 2/2005 | Searls et al. | |
| 6,864,571 B1 | 3/2005 | Arik et al. | |
| 6,891,724 B1 | 5/2005 | De Lorenzo et al. | |
| 6,921,462 B1 | 7/2005 | Montgomery et al. | |
| 6,924,335 B1 | 8/2005 | Fan et al. | |
| 6,962,823 B1 | 11/2005 | Empedocles et al. | |

(Continued)

FOREIGN PATENT DOCUMENTS

EP    1329953 A1    8/2003

(Continued)

OTHER PUBLICATIONS

Zhang, " Formation Of metal Nanowires On Suspended Single—Walled Carbon Nanotubes", Appl. Phys. Lett, vol. 77(19), p. 3015 (2000).*

(Continued)

*Primary Examiner*—Asok Kumar Sarkar
(74) *Attorney, Agent, or Firm*—Morgan, Lewis & Bockius LLP

(57) ABSTRACT

Heat sink structures employing carbon nanotube or nanowire arrays to reduce the thermal interface resistance between an integrated circuit chip and the heat sink are disclosed. Carbon nanotube arrays are combined with a thermally conductive metal filler disposed between the nanotubes. This structure produces a thermal interface with high axial and lateral thermal conductivities.

24 Claims, 7 Drawing Sheets

U.S. PATENT DOCUMENTS

| | | | |
|---|---|---|---|
| 6,965,513 B1 * | 11/2005 | Montgomery et al. ...... | 361/687 |
| 6,989,325 B1 | 1/2006 | Uang et al. | |
| 2002/0090501 A1 | 7/2002 | Tobita | |
| 2002/0100581 A1 | 8/2002 | Knowles et al. | |
| 2002/0130407 A1 | 9/2002 | Dahl et al. | |
| 2002/0145194 A1 | 10/2002 | O'Conner et al. | |
| 2002/0163079 A1 | 11/2002 | Awano | |
| 2003/0111333 A1 | 6/2003 | Montgomery et al. | |
| 2003/0117770 A1 | 6/2003 | Montgomery et al. | |
| 2003/0231471 A1 | 12/2003 | De Lorenzo et al. | |
| 2004/0005736 A1 * | 1/2004 | Searls et al. ................ | 438/122 |
| 2004/0013598 A1 | 1/2004 | McElrath et al. | |
| 2004/0053053 A1 | 3/2004 | Jiang et al. | |
| 2004/0101468 A1 | 5/2004 | Liu | |
| 2004/0146560 A1 | 7/2004 | Whiteford et al. | |
| 2004/0150100 A1 * | 8/2004 | Dubin et al. ................ | 257/720 |
| 2004/0182600 A1 | 9/2004 | Kawabata et al. | |
| 2004/0184241 A1 | 9/2004 | De Lorenzo et al. | |
| 2004/0191158 A1 | 9/2004 | Liu et al. | |
| 2004/0218362 A1 * | 11/2004 | Amaro et al. ............... | 361/697 |
| 2004/0261978 A1 | 12/2004 | Zhan et al. | |
| 2004/0261987 A1 * | 12/2004 | Zhang et al. ............... | 165/183 |
| 2004/0265489 A1 | 12/2004 | Dubin | |
| 2004/0266063 A1 | 12/2004 | Montgomery et al. | |
| 2004/0266065 A1 | 12/2004 | Zhang et al. | |
| 2005/0006754 A1 * | 1/2005 | Arik et al. .................. | 257/712 |
| 2005/0037204 A1 * | 2/2005 | Osiander et al. ............ | 428/408 |
| 2005/0061496 A1 | 3/2005 | Matabayas | |
| 2005/0067693 A1 | 3/2005 | Nihei et al. | |
| 2005/0092464 A1 | 5/2005 | Leu et al. | |
| 2005/0116336 A1 | 6/2005 | Chopra et al. | |
| 2005/0136248 A1 | 6/2005 | Leu et al. | |
| 2005/0139642 A1 | 6/2005 | Koning et al. | |
| 2005/0139991 A1 | 6/2005 | White et al. | |
| 2005/0150887 A1 | 7/2005 | Taya eta l. | |
| 2005/0167647 A1 | 8/2005 | Huang et al. | |
| 2005/0224220 A1 | 10/2005 | Li et al. | |
| 2005/0238810 A1 | 10/2005 | Scaringe et al. | |
| 2005/0260412 A1 | 11/2005 | Gardner et al. | |
| 2005/0269726 A1 | 12/2005 | Matabayas, Jr. | |

FOREIGN PATENT DOCUMENTS

| | | |
|---|---|---|
| WO | WO 03/054958 A1 | 7/2003 |
| WO | WO 03/072679 A1 | 9/2003 |
| WO | WO 03/107419 A1 | 12/2003 |

OTHER PUBLICATIONS

Banerjee, Kaustav, et al., "3-D Heterogeneous ICs: A Technology for the Next Decade and Beyond", *5th IEEE Workshop on Signal Propagation on Interconnects*, Venice, Italy, May 13-16, 2001.

Cassell, Alan, "Directed Growth of Free-Standing Single-Walled Carbon Nanotubes", *J Am.. Chemical Society*, 1999, 121, pp. 7975-7976.

Chiang, Ting-Yen, "A New Analytical Thermal Model for Multi-level ULSI Interconnects Incorporating Via Effect", Center for Integrated Systems, Stanford University (no date given).

Chiang, Ting-Yen, et al., "Effect of Via Separation and Low-k Dielectric Materials on the Thermal Characteristics of Cu Interconnects", *IEDM 2000* (no date).

Cui, Yi, et al., "Doping and Electrical Transport in Silicon Nanowires", *Journal of Physical Chemistry*. vol. 104, No. 22, Jun. 8, 2000, pp. 5213-5216.

de Pablo, P.J., "A simple, reliable technique for making electrical contact to multiwalled carbon nanotubes", *Applied Physics Letters*, vol. 74, No. 2, Jan. 11, 1999, pp. 323-325.

Delzeit, Lance, et al., "Growth of carbon nanotubes by thermal and plasma chemical vapour deposition processes and applications in microscopy", *Nanotechnology*, vol. 13, May 23, 2002, pp. 280-284.

Delzeit, Lance, et al., "Growth of multiwall carbon nanotubes in an inductively coupled plasma reactor", *Journal of Applied Physics*, vol. 91, No. 9, May 1, 2002, pp. 6027-6033.

Goodson, K.E., et al., "Improved Heat Sinking for Laser-Diode Arrays Using Microchannels in CVD Diamond", *IEE Transactions on Components, Packaging, and Manufacturing Technology*, Part B, Advanced Packaging, vol. 20, Issue 1, Feb. 1997. pp. 104-109.

Hone, J., et al., "Thermoelectric Power of Single-Walled Carbon Nanotubes", *Physical Review Letters*, vol. 80, No. 5, Feb. 2, 1998, pp. 1042-1045.

Huang, Z.P., et al. "Growth of highly oriented carbon nanotubes by plasma-enhanced hot filament chemical vapor deposition", *Applied Physics Letters*, vol. 73, No. 26, Dec. 28, 1998, pp. 3845-3847.

*International Semiconductor Road Map* (ITRS-2001), Section on Interconnect, http://public/itrs.net/files/2001ITRS/interconnect.pdf.

Kim, Mun Ja, et al., "Growth characteristics of carbon nanotubes via aluminum nanopore template on Si substrate using PECVD", *Elsevier Thin Solid Films*, vol. 425, 2003, pp. 312-317.

Kong, Jing, et al., "Systhesis of individual single-walled carbon nanotubes on patterned silicon wafers", *Nature*, vol. 395, Oct. 29, 1998. pp. 878-881.

Kurabayashi, K, et al., "Precision Measurement and Mapping of Die-Attach Thermal Resistance", *IEEE Transactions on Components, Packaging, and Manufacturing Technology*, Part A: Advanced Packaging, vol. 21, Issue 3, Sep. 1998. pp. 506-514.

Li, Jun, et al., "Electronic properties of multiwalled carbon nanotubes in an embedded vertical array", *Applied Physics Letters*, vol. 81, No. 5, Jul. 29, 2002, pp. 910-912.

Liu, Jie, et al., "Controlled deposition of individual single-walled carbon nanotubes on chemically functionalized templates", *Chemical Physics Letters*, 303, Apr. 2, 1999, pp. 125-129.

McEuen, Paul L., et al., "Single-Walled Carbon Nanotube Electronics", *IEEE Transactions on Nanotechnology*, vol. 1, No. 1, Mar. 2002, pp. 78-85.

Meyyappan, M., et al., "Carbon nanotube growth by PECVD: a review", *Plasma Sources Science and Technology*, vol. 12, Apr. 2, 2003, pp. 205-216.

Ren, Z.F., et al., "Synthesis of Large Arrays of Well-Aligned Carbon Nanotubes on Glass", *Science*, vol. 282, Nov. 6, 1998, pp. 1105-1107.

Shi, Li., "A Microdevice for Measuring Thermophysical Properties of Nanowires and Nanotubes", *2001 ASME International Mechanical Engineering Congress and Exposition*, Nov. 11-16, 2001, pp. 359-362.

Shi, Li., "Scanning thermal microscopy of carbon nanotubes using batch-fabricated probes", *Applied Physics Letters* vol. 77, No. 26, Dec. 25, 2000, pp. 4295-4297.

Stevens, R., "Improved fabrication approach for carbon nanotube probe devices", *Applied Physics Letters*, vol. 77, No. 21, Nov. 20, 2000, pp. 3453-3455.

Sun, X, et al., "Theoretical modeling of thermoelectricity in Bi nanowires", *Applied Physics Letters*, vol. 74, No. 26, Jun. 28, 1999, pp. 4005-4007.

Yakobson, Boris I., et al., "Fullerene Nanotubes: $C_{1,000,000}$ and Beyond", *American Scientist online*, http://www.americanscientist.org/template/AssetDetail/assetid/2870?fulltext=true&print=yes.

Zhang, Yuegang, et al., "Electric-field-directed growth of aligned single-walled carbon nanotubes", *Applied Physics Letters*. vol. 79, No. 19, Nov. 5, 2001, pp. 3155-3157.

Zhang, Wei De, et al., "Synthesis of vertically aligned carbon nanotubes films on silicon wafers by pyrolysis of ethylenediamine", *Elsevier, Thin Solid Films*, 422, 2002, pp. 120-125.

Zhou, P., et al., "Thermomechanical Diagnostics of Flip-Chip/BGA Structures Using Phase-Shifting Electronic Speckle Pattern Interferometry", *EEP, Advances in Electronic Packaging*, vol. 26-2, ASME, 1999, pp. 1875-1880.

Jun Li et al., Bottom Up Approach for Carbon Nanotube Interconnects, Applied Phys. Letters, Apr. 18, 2003, 2491-2493, vol. 82, No. 15, American Institute of Physics.

Jun Li et al., Electronic Properties of Multiwalled Carbon Nanotubes in an Embedded Verticle Array, Applied Phys. Letters, Jul. 29, 2002, 910-912, vol. 81, No. 5, American Institute of Physics.

Tu et al., Growth of Aligned Carbon Nanotubes with Controlled Site Density, Applied Phys. Letters, May 27, 2002, 4018-4020, vol. 80, No. 21, American Institute of Physics.

Berber et al., Unusualy High Thermal Conductivity of Carbon Nanotubes, Physical Review Letters, May 15, 2000, 4613-4616, vol. 84, No. 20.

Delzeit et al., Growth of Multi-wall Nanotubes in an Inductively Coupled Plasma Reactor, Journal of Applied Physics, May 1, 2002, 6027-6034, vol. 91, No. 9.

* cited by examiner

SYSTEM AND METHOD USING SELF-ASSEMBLED NANO STRUCTURES IN THE DESIGN AND FABRICATION OF AN INTEGRATED CIRCUIT MICRO-COOLER

REFERENCES TO PRIOR APPLICATIONS

This application is related to provisional application No. 60/497,849 filed Aug. 25, 2003 entitled SYSTEM AND METHOD USING SELF-ASSEMBLED NANO STRUCTURES IN THE DESIGN AND FABRICATION OF AN INTEGRATED CIRCUIT MICRO-COOLER, and claims benefit thereof.

BACKGROUND OF THE INVENTION

1. Field of the Invention

This invention relates to the removal of heat generated by an integrated circuit and the components used in chip assembly and packaging to facilitate said heat removal. More specifically, this invention discloses the application of self-assembled nano-structures for improving the performance of heat sink structures coupled to integrated circuit devices.

2. Description of the Related Art

Prior art used to cool semiconductor ICs incorporates the use of large and expensive chip packaging having externally mounted, finned heat sinks coupled to the ceramic or plastic encapsulated IC chip. As the speed and density of modern integrated circuits increase, the power generated by these chips also increases, often in geometric proportion to increasing density and functionality. In the video processing and CPU application areas, the ability to dissipate the heat being generated by current ICs is becoming a serious limitation in the advance of technology. In the current art, relatively large interface-thermal-resistances are added when the die is 'attached' to a heat spreader, heat pipe or heat sink. These multiple interfaces have the undesired side effect of increasing total die to heat sink resistance and making heat transfer more difficult.

FIG. 1 (Prior Art) is a cross section schematic view of a simplified integrated circuit structure. Transistor structure 102 is formed near the top surface of substrate 100. Electrical interconnects 106 are used to make contact with transistor 102 and numerous other similar devices (not shown) on the substrate 100. "Solder balls" 104 are utilized to complete the interconnect of the integrated circuit to a printed circuit board or wire leadframe. This type of package is often referred to as a "flip chip" device. In the current art, heat generated by transistor 102 is extracted through the substrate 100 to the back surface of the chip. A heat transfer bonding layer 108 may be utilized to enhance heat conduction by reducing interfacial heat transfer resistance created by air gaps and surface irregularities. Typically, this layer may be composed of a thermal grease or thermally conductive epoxy. These materials, while better that solid surface/surface contact, still have a relatively poor thermal conductivity when compared to solid metals. As a result, the backside chip surface interface still presents a significant thermal resistance which limits the power that can be extracted from the chip.

Recently, U.S. Patent Application Publication No. US2003/0117770 has disclosed a process of forming a thermal interface that employs carbon nano-tubes to reduce thermal resistance between an electronic device and a heat sink. Bundles of aligned nano-tubes receive injected polymeric material in molten form to produce a composite which is placed between the electronic device and the heat sink. The nano-tubes are aligned parallel to the direction of heat energy. However, the polymeric filler does little to spread heat laterally, potentially creating localized hot spots on the device surface. The use of bundles of aligned carbon nano-tubes may result in reduced thermal conduction as well. Theoretical molecular dynamics simulations have shown that isolated carbon nano-tubes show unusually high thermal conductivity, but that the thermal conductivity degrades by an order of magnitude when carbon nano-tube bundles are formed with tube-to-tube contacts (see for example Savas Berber, et al, Physics Review Letters, 84, no.20, 4613, May 2000). US Patent Application Publication US2003/231471 discloses an integrated circuit package that utilizes single wall or double wall carbon nano-tube arrays grown subsequent to the deposition of CVD diamond films. Due to the roughness of CVD diamond films, carbon nano-tubes are utilized to aid in making thermal contact between the surfaces of the circuit silicon die and of the integrated heat spreader. The interstitial voids between the nano-tubes are not filled in order to maintain flexibility. This disclosure, however, fails to provide any method to reduce matting and nano-tube to nano-tube contact, which reduces the effective thermal conductivity of the structure. Although CVD diamond films are good conductors, they may not be thermally compatible (from an expansion perspective) with a number of other metallic materials utilized in various heat sink structures. Additionally, commonly known techniques for growing carbon nano-tubes would preclude carbon nanotube deposition directly on a silicon circuit die, since these techniques require temperatures in the range of 700 to 800° C. Exposing a completed circuit die to these elevated temperatures is not a recommended practice.

What is needed is a method and structure by which interface resistances are minimized by integrating several thermal components to maximize heat transfer from hot surfaces on the integrated circuit.

SUMMARY OF THE INVENTION

It is an object of the present invention to provide a micro-cooler device structure containing a heat sink body having a heat sink surface, a plurality of individually separated, rod like nano-structures for transferring thermal energy from a surface of at least one integrated circuit chip to the heat sink surface, the plurality of individually separated, rod-like nano-structures being disposed between the heat sink surface and the surface of the integrated circuit chip, and a thermally conductive material disposed within interstitial voids between the rod-like nano-structures.

In one embodiment of the present invention, a method for fabricating a micro-cooler device includes fashioning a shallow cavity in a mounting surface of a heat sink body, growing rod-like nano-structures within the shallow cavity, and depositing a thermally conductive material in interstitial voids between the rod-like nano-structures.

BRIEF DESCRIPTION OF THE DRAWINGS

The present invention will be better understood when consideration is given to the following detailed description thereof. Such description makes reference to the annexed drawings, wherein.

DETAILED DESCRIPTION OF THE PREFERRED EMBODIMENTS

Figure 1:
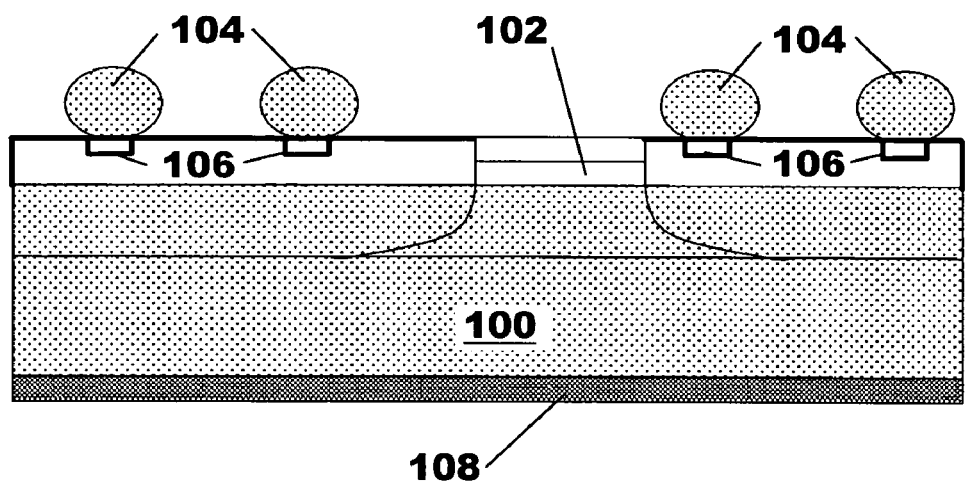
FIG. 1 (Prior Art) is a cross section schematic view of an integrated circuit structure.

FIG. 1 (prior art) has been addressed above in the Background section of this disclosure.

Figure 2:
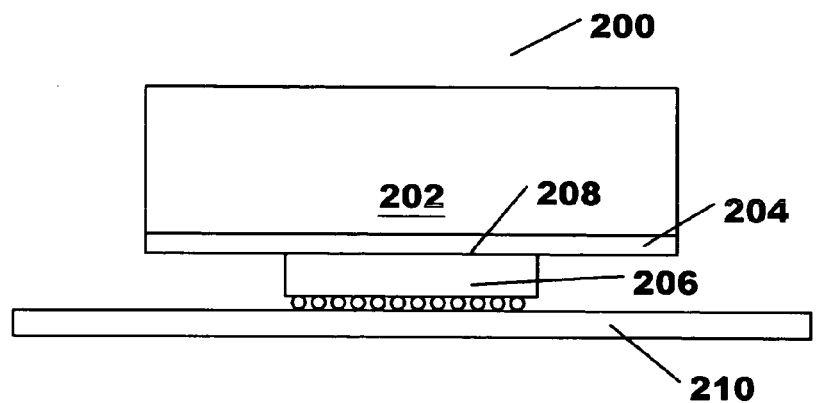
FIG. 2 is a schematic side view of integrated micro-cooler device attached to a flip chip integrated circuit according to an embodiment of the present invention.

FIG. 2 is a schematic side view 200 of integrated microcooler device 202 attached to a flip chip integrated circuit 206 according to an embodiment of the present invention. The integrated micro-cooler device 202 is a separate structure from chip 206 containing highly conductive, self assembled nano structures, integrated with heat sinking devices. It provides a low thermal resistance path for heat transferred from surface 208 of the integrated circuit chip 206 mounted on circuit board 210 below. Thermal interface layer 204 provides a low resistance interface containing nano-structures to enhance heat conduction from chip 206, reduce the impact of local hot spots in chip 206, and laterally conduct heat to a heat sink structure 202 of greater footprint than the chip 206. Structural details of micro-cooler device 202 are disclosed below. Chip 206 and micro-cooler 202 may be bonded together using eutectic layers or thermal bonding adhesives (not shown), as is known to those skilled in the art. Additionally, micro-cooler device 202, integrated circuit chip 206, and circuit board 210 may be held together with mechanical straps, clips, or holding devices (not shown).

Figure 3:
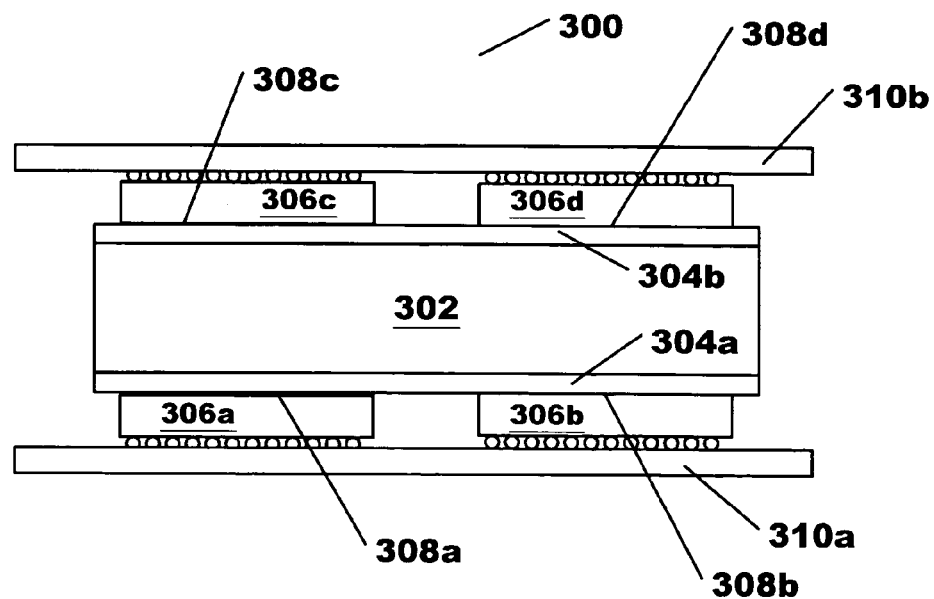
FIG. 3 is a schematic side view of integrated micro-cooler device attached to multiple flip chip integrated circuits according to an embodiment of the present invention.

FIG. 3 is a schematic side view 300 of integrated microcooler device 302 attached to multiple flip chip integrated circuits (306a–306d) according to an embodiment of the present invention. In this embodiment, both the upper and lower surfaces of micro-cooler device 302 are utilized to remove heat energy from flip chip ICs 306a–306d. Chips 306a and 306b, mounted on printed circuit board 310a, sink heat from surfaces 308a and 308b, to device 302 via interface layer 304a. Chips 306c and 306d, mounted on printed circuit board 310b, sink heat from surfaces 308c and 308d, to device 302 via interface layer 304b. Chips 306 and micro-cooler 302 may be bonded together using eutectic layers or thermal bonding adhesives (not shown), as is known to those skilled in the art. Additionally, micro-cooler device 302, integrated circuit chips 306, and circuit boards 310 may be held together with mechanical straps, clips, or holding devices (not shown). Although the embodiment shown in FIG. 3 contains four integrated circuits, it should be evident to those of ordinary skill in the art that any number of additional integrated circuit flip chips 306 may be added by increasing the scale of device 302.

Figure 4:
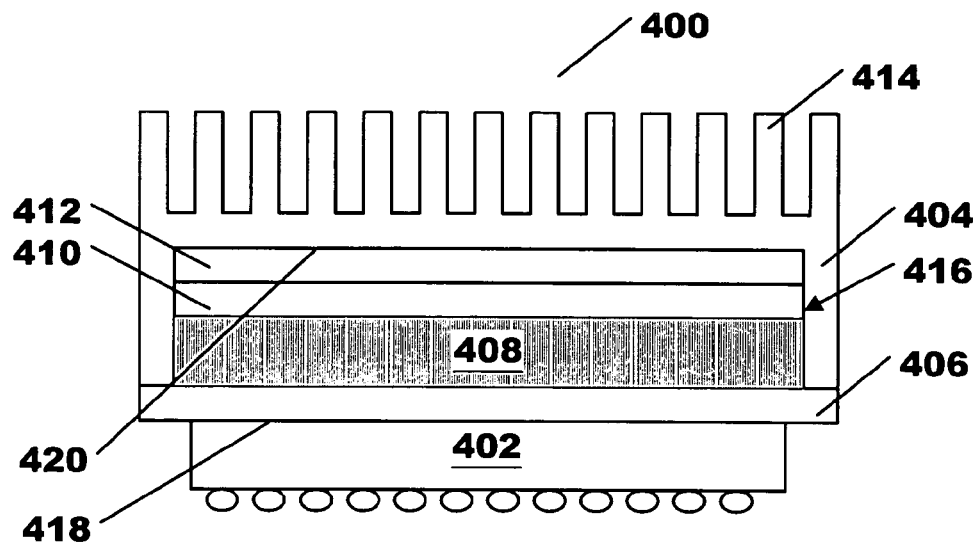
FIG. 4 is a cross section schematic view of a finned integrated micro-cooler device showing the details of construction according to an embodiment of the present invention.

FIG. 4 is a cross section schematic view of a finned integrated micro-cooler device 400 showing the details of construction according to an embodiment of the present invention. The device 400 comprises a heat sink body 404 for extracting thermal energy from surface 418 of flip chip 402. Heat energy is delivered to heat sink surface 420 by an enhanced heat transfer interface structure containing layers 408, 410, and 412. Heat sink body 404 is fabricated with fins 414 (or pin shaped structures) to enhance heat extraction by convection, typically forced air flow generated by fans or other devices. However, natural convection may also be employed if suitable. Also, fins 414 may be immersed in a liquid such as water or another liquid phase coolant for removal of high energy fluxes. Heat sink body 404 may be made from silicon, metals, or heat conductive ceramics. Metals such as copper or aluminum are preferred, but structures fashioned from silicon substrates may also be used. If silicon is used, the fin surfaces may be coated with a metal to enhance lateral heat conduction. Heat spreading cavity 416 is fashioned within heat sink body 404, by methods well known to those skilled in the art, to contain heat transfer interface layers 408, 410, and 412.

Layer 408 contains individually separated, rod-like nanostructures that provide very high thermal conductivity to reduce interface contact resistance. These structures may be comprised of metallic nano-wires, or preferably multi walled carbon nano-tubes (MWCNT) or multi-wall carbon nano-fibers. Metallic nanowires (for example Au, Cu, Ni, zinc oxide, and metal borides) are metal crystals having the shape of a wire with dimensions comparable to the phonon mean free path (usually tens of nanometers at room temperature) so as to benefit from quantum confinement phenomena allowing for efficient heat transport characteristics and thermal contact. In one example, metal boride nanowires are believed to have good thermal contact resistance since low ohmic contact resistance has been demonstrated with Ni electrodes. Preferably, the MWCNTs are oriented (with their longitudinal axis) approximately perpendicular to surfaces 420 and 418, parallel to the direction of heat flow. MWCNTs have very high (on axis) thermal conductivity, generally within the range of 800 to 3000 W/m-° K. They may be up to a factor of two better than solid CVD diamond films. They are preferably grown on the micro-cooler 400 surface as an array of free standing, vertically aligned, individually separated carbon nanotubes (or nanofibers) that occupy between about 15 and 40% of the surface from which they are grown. In some embodiments, the MWCNT are grown by plasma enhanced CVD (PECVD) growth methods. For example, the methods described by Jun Li et al. (Applied Physics Letters, vol. 81, no. 5, July 2002) and L. Delzeit et al. (J. Appl. Physics 91, 6027, May, 2002) can be used. However, while axial thermal conduction of CNTs is very high, lateral thermal conduction (in the non-axial direction from nano-tube to nano-tube) is not as good. In fact, it has been found that lateral contact between axially aligned nano-tubes can reduce their effective axial thermal conductivity. If the number of carbon nano-tubes attached to substrate is too high (for example, >40% CNT density) Van der Waals force will create a bundle or mat situation resulting in poor thermal conduction. If, on the other hand the coverage density is too low (for example, <15%), thermal conduction will also be lower due to the reduced number of conducting nano-tubes. A preferred range a coverage density is between about 15 and 40%, with 25% to 40% being most preferred. Thus, as opposed to bundle or mat of CNTs, vertically aligned, individually separated, parallel CNTs with coverage between about 15 and 40%, can provide better overall thermal conduction. To improve lateral heat conduction, a thermally conductive material is placed within the interstitial voids between the MWCNTs. The thermally conducting material provides lateral heat conduction within the nano-tube containing layer. Lateral heat conduction facilitates the spreading of heat from a relatively small silicon die surface to the much larger surface area of the heat sink body 404. It also reduces localized hot spots on surface 418 of chip 402. The thermally conductive material may be a metal or metal alloy, thermally conductive ceramics, CVD diamond, or thermally conductive polymers. Preferably, the thermally conductive material is a metal such as copper, aluminum, silver, gold, or their alloys. Of the metal materials, copper and copper alloys are the most preferable. This is generally due to the high thermal conductivity, ease of deposition via electroplating or electrochemical deposition, and low cost. Copper electroplating is well known to those skilled in the art of dual Damascene processing common in the production of modern integrated circuits. Depending on the thermal conductivity of the thermally conductive filler material, layer 408 would typically be between 50 and 1000 microns in thickness.

Another desirable feature of using metal as a filler material is that it is significantly lower in hardness than the MWCNTs. In some embodiments, planarization of layer 408 is used to maintain flatness for good "long range" contact. However, "short range" surface irregularities (on the order of a few microns) can also contribute significantly to interface thermal resistance. It is therefor desirable to have some portion of the MWCNTs extend from the bulk of layer 408 so that the exposed ends may conform to these surface irregularities and improve thermal contact. When layer 408 is planarized, the softer metal material is eroded more than the harder nanotubes, resulting in an undercutting of the metal layer. This undercutting leaves a portion of the nanotubes extending from the composite layer 408. This undercutting will automatically occur when layer 408 is planarized with CMP (chemical-mechanical planarization) or electrochemical etching techniques. An additional (optional) bonding layer 406 can be added, if eutectic metal bonding between chip 402 and layer 408 is desired. In this case, the exposed nanotube ends would protrude into this layer and may extend through it. Preferably, bonding layer 406 is a eutectic metal, but thermal polymer based bonding compounds may also be used. Layer 412 is an interface material which can be used with a silicon heat sink body 404. Typically, layer 412 would be composed of silicon nitride compounds. For metal heat sink bodies 404, layer 412 is optional, is only required to aid in the adhesion of catalyst metal layer 410. Metal catalyst layer 410 is used to initiate and control growth of the nanotubes in layer 408. Metal catalyst layer 410 may chosen from among Ti, Co, Cr, Pt, Ni and their alloys. Preferably, metal catalyst layer 410 are Ni and Ni alloys. Further process conditions related to these layers are discussed below.

Figure 5:
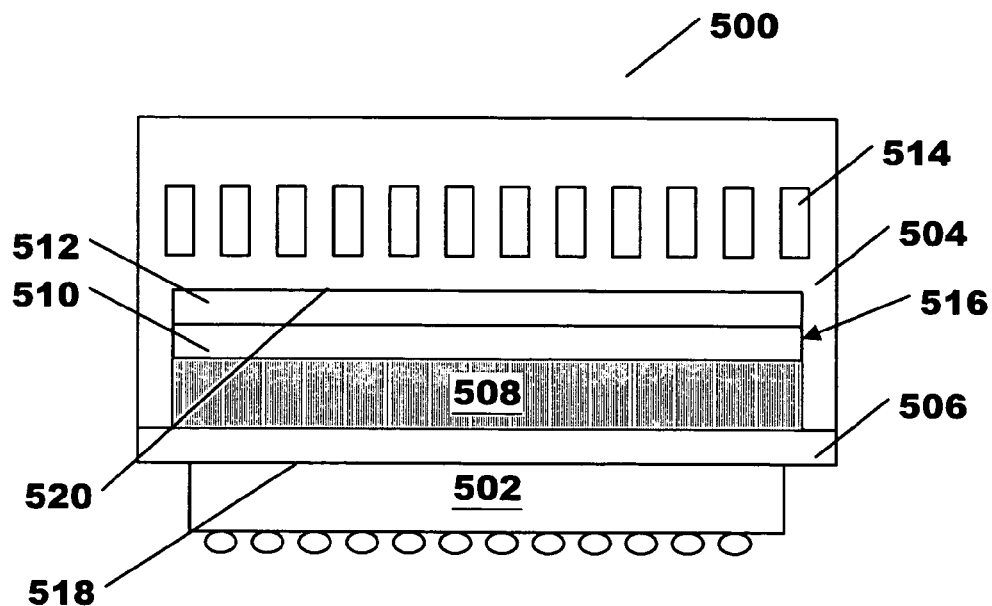
FIG. 5 is a cross section schematic view of an integrated micro-cooler device having internal flow channels according to an embodiment of the present invention.

FIG. 5 is a cross section schematic view of an integrated micro-cooler device 500 having internal flow channels 514 according to an embodiment of the present invention. The device 500 comprises a heat sink body 504 for extracting thermal energy from surface 518 of flip chip 502. Heat energy is delivered to heat sink surface 520 by an enhanced heat transfer interface structure containing layers 508, 510, and 512. Layers 508–512 reside in heat spreading cavity 516 fashioned in body 504. In this embodiment, heat sink body 504 contains enclosed flow passages 514 to remove the thermal energy transferred from chip 502. Both liquid and gas cooling is possible, but for this embodiment liquid cooling is preferred due to the specific heat capacity of a liquid coolant such as water. A refrigerant is also possible for use in very high heat removal systems, or where sub ambient junction temperatures are required for very high speed processors. Due to the high heat fluxes encountered by such systems, the low thermal resistances provided by embodiments of the present invention become essential to reliable operation. Layers 506–512 have the same function and are composed of the same materials as described above for corresponding layers 406–412.

Figure 6:
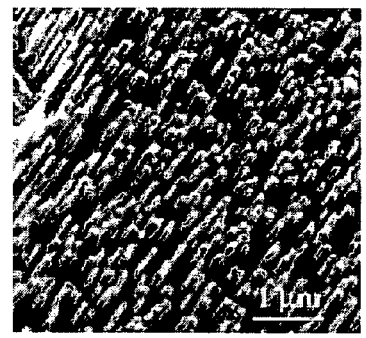
FIG. 6 is an electron microscope photo of carbon nanotubes according to an embodiment of the present invention.

FIG. 6 is an electron microscope photo of carbon nanotubes according to an embodiment of the present invention. In this figure, the aligned, individually separated, parallel nature of the MWCNTs is evident. Also evident are the interstitial voids between nanotubes that need to be filled for good lateral heat conduction.

Figure 7:
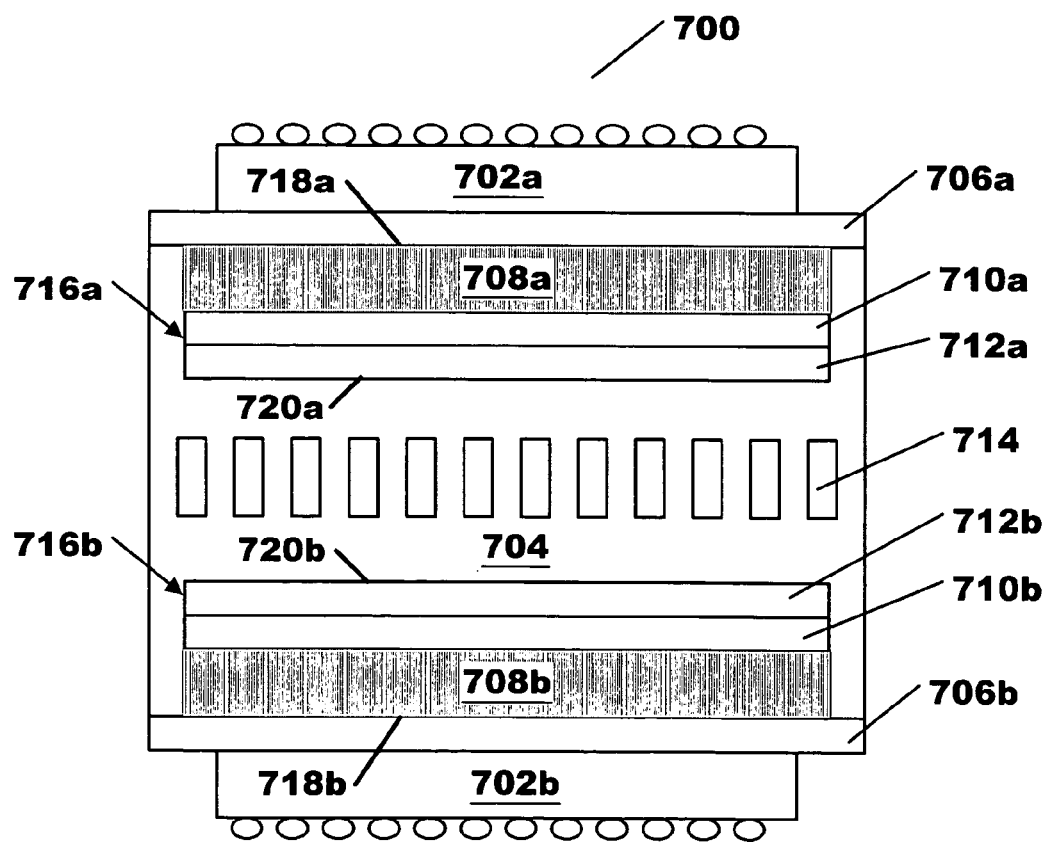
FIG. 7 is a cross section schematic view of an integrated micro-cooler device bonded to multiple flip chip integrated circuits according to an embodiment of the present invention.

FIG. 7 is a cross section schematic view of an integrated micro-cooler device 700 attached to multiple flip chip integrated circuits according to an embodiment of the present invention. The device 700 comprises a heat sink body 704 for extracting thermal energy from heat generating multiple flip chips 702a and 702b. Heat energy is delivered to heat sink surfaces 720a and 720b by an enhanced heat transfer interface structure containing layers 508a–512a and 508b–512b. Layers 508a–512a and 508b–512b reside in heat speading cavities 716a and 716b, respectively. In this embodiment, heat sink body 704 contains enclosed flow passages 714 to remove the thermal energy transferred from chip 502. For this embodiment, due to the increased heat loading, liquid cooling is preferred due to the specific heat capacity of a liquid coolant such as water. A refrigerant is also possible for removal of the high heat loads, or where sub ambient junction temperatures are required for very high speed processors. Layers 706a–712a and 706b–712b have the same function and are composed of the same materials as described above for corresponding layers 406–412.

Figure 8:
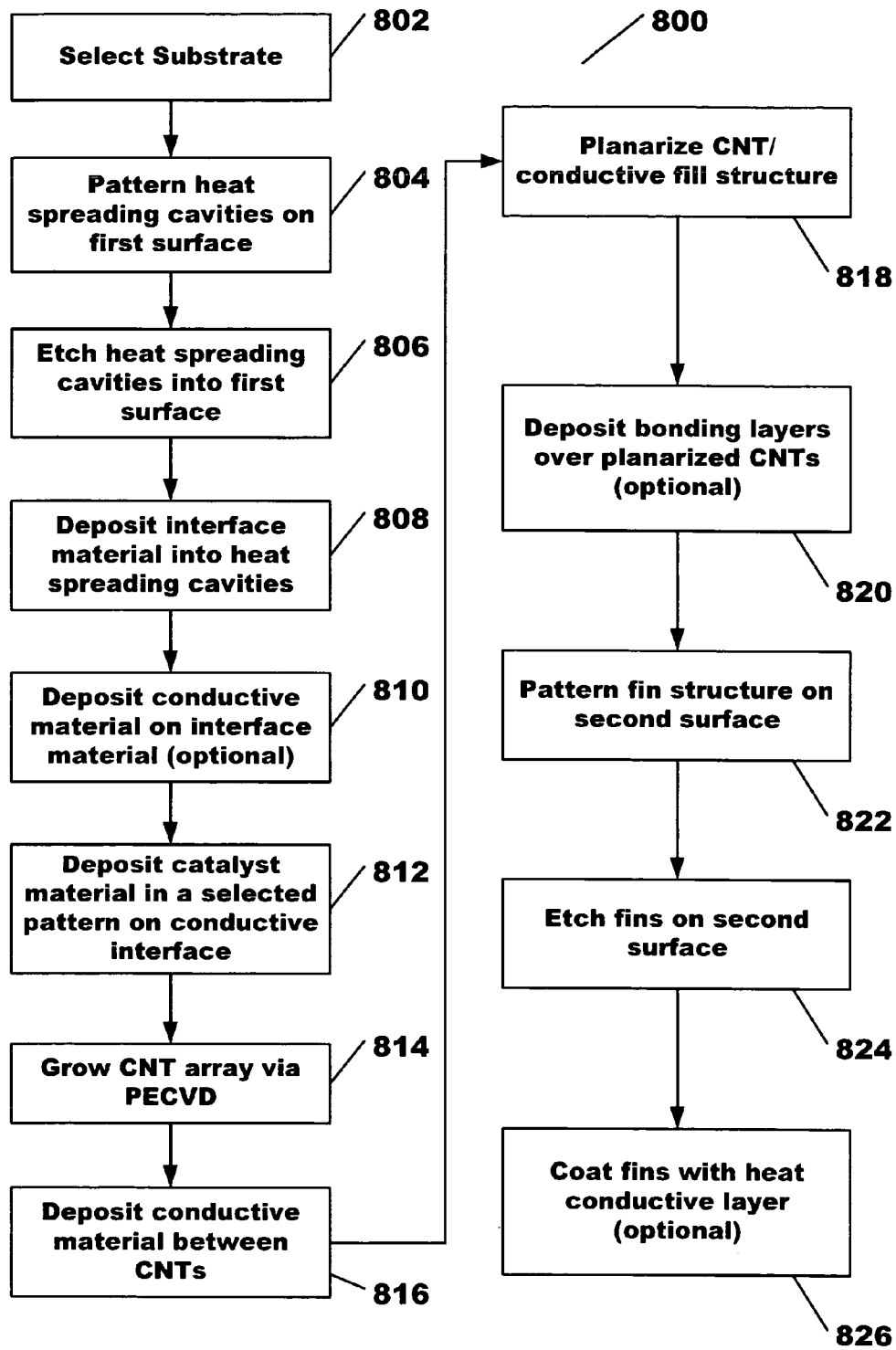
FIG. 8 is a process flow diagram illustrating the steps for manufacture of a finned integrated micro-cooler device according to an embodiment of the present invention.

FIG. 8 is a process flow diagram 800 illustrating exemplary steps for manufacture of a finned integrated microcooler device according to an embodiment of the present invention. At 802, a suitable material is selected for the substrate or heat sink body (e.g., 404). The subsequent steps refer to a process where silicon is chosen as the substrate. At 804, heat spreading cavities (e.g., 416) are patterned in a first (or bottom) surface. At 806, the heat spreading cavities are etched, and at 808, an interface material (e.g., 412) is deposited in the cavities (e.g., 416). As previously mentioned, this interface material is silicon nitride in some embodiments. Numerous techniques are known to those skilled in the art to deposit silicon nitride, examples of which are CVD, or sputtering. Alternatively, the heat spreading cavities can be fabricated by machining if the heat sink body material is chosen to be a metal or ceramic. At 810, an optional conductive layer is deposited over the interface layer, to facilitate the deposition and adhesion of the subsequent catalyst layer. The conductive layer would be composed of Ti, Cr, or Pt with thickness in the range of 3 nm–200 nm. If the heat sink body is metal, a conductive layer may not be required. At 812, a catalyst material chosen from among Ti, Co, Cr, Pt, Ni, and their alloys is deposited using CVD, PVD, electroplating or electroless deposition to a layer thickness of 3 nm to 30 nm. At 814, a carbon nanotube array (e.g., as part of layer 408) of individually separated carbon nanotubes is grown. In some embodiments, the array is grown via PECVD per the method of J. Li and A. Delzeit referenced previously. At 816, a thermally conductive material is deposited between the carbon nanotubes. For a thermally conductive material that is a metal, the material is typically deposited by electrochemical deposition or CVD as is known to those skilled in the art. If a CVD diamond interstitial material is used, CVD processes known in the art can be used. At 818, the carbon nanotube containing layer (e.g., 408) is planarized by CMP, electrochemical etching, or a combination of both. At 820, an optional eutectic bonding layer (e.g., 406) of appropriate thickness is added if desired. At 822, fins (e.g., 414) are patterned in a second (or top) surface for silicon substrates. At 824, the fins are etched by well known methods. At 826, the fins are coated with an optional metal coating or CVD diamond, deposited at the appropriate thickness required to minimize temperature gradients along the fins' surfaces. For the case of a metal heat sink body (e.g., 404), the fins are fabricated by well known machining processes.

Figure 9:
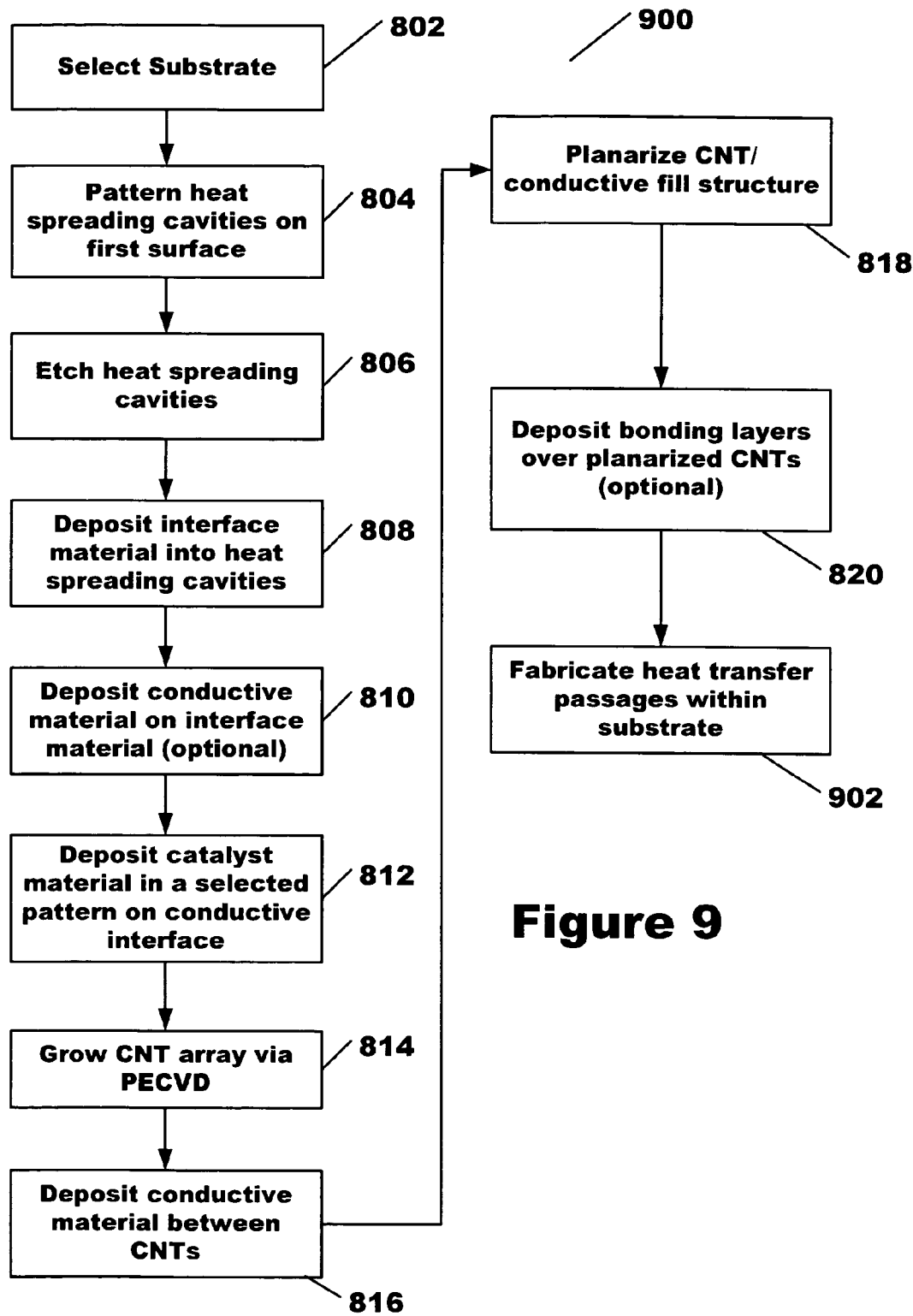
FIG. 9 is a process flow diagram illustrating the steps for manufacture of an integrated micro-cooler device having internal flow channels according to an embodiment of the present invention; and, FIG. 10 is a partial cross section view of the nanostructure array subsequent to a planarization process according to an embodiment of the present invention.

FIG. 9 is a process flow diagram 900 illustrating examplary steps for manufacture of an integrated micro-cooler device having internal flow channels according to an embodiment of the present invention. At 902, the flow passages (e.g., 514) are fabricated in the heat transfer body (e.g., 504). For metal bodies, standard machining techniques can be used. For silicon substrates, fins may be fabricated as described in the embodiments shown in FIG. 8. A suitable metal, ceramic, or silicon plate or cover is adhesively bonded to the top, flat surfaces of the fins to create enclosed passages (e.g., 514).

Figure 10:
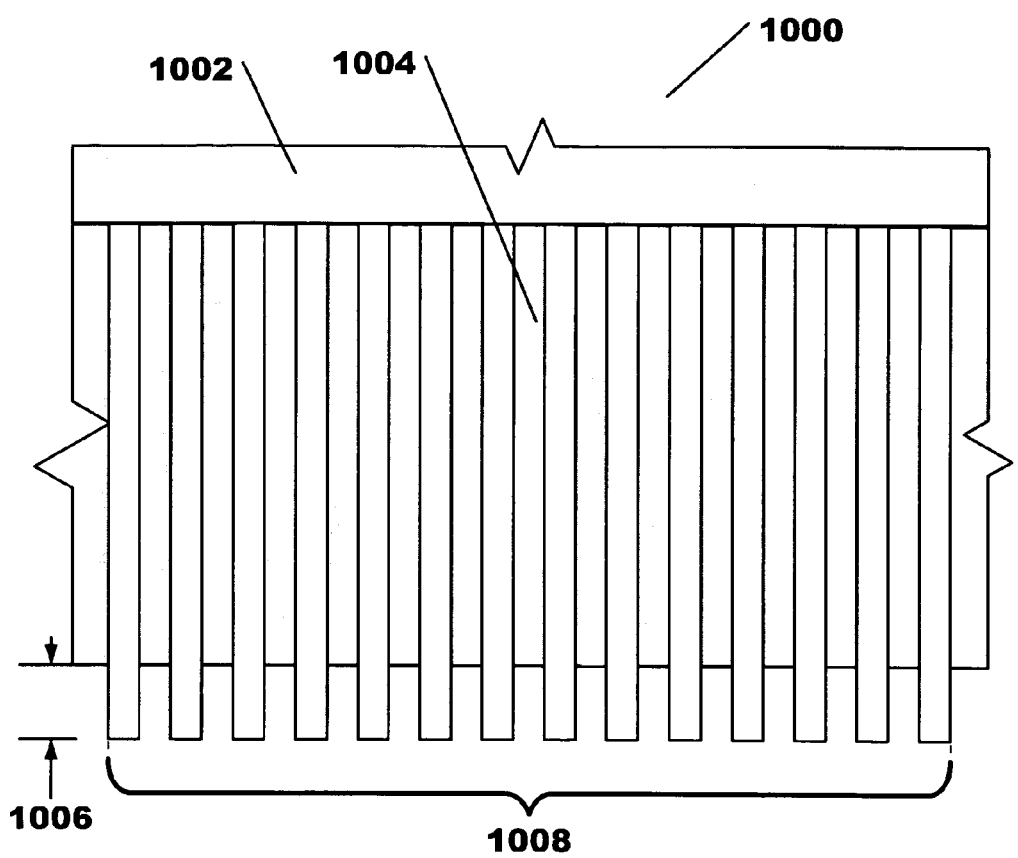

FIG. 10 is a partial cross section view 1000 of the nano-structure array subsequent to a planarization process according to an embodiment of the present invention. Carbon nanotubes or nanowires 1008 are grown from the metal/catalyst layer 1002 in an approximately parallel structure as shown. As previously described, a thermally conductive filler material 1004 is placed in the voids between the nano-strucures 1008. Planarization of the nano-structures produces a gap 1006 between the ends of the nano-structures and the recessed planarized surface of the filler material. Gap 1006 results from a chemical-mechanical planarization (CMP) process when a composite material containing components of significantly different hardness is planarized. In the case where the nano-structures are MWCNTs and the filler is a metal such as copper, aluminum, or silver, the planarization process will undercut the filler since the metal is much softer than the carbon nanotubes. The same effect can be created by chemical (or electrochemical) etching of the filler metal, since base metals such as copper are more reactive and susceptible to chemical dissolution than the relatively chemically inert carbon nanotubes.

The unsupported nano-structures in gap 1006 are relatively flexible, allowing the exposed ends to twist and bend (on a micron scale) to conform to undulations and imperfections in the heat generating surface of the integrated circuit chip. This "hair brush" effect produces intimate contact with the ends of the nano-structures, allowing heat extraction along the axis of the nanotubes, where their thermal conductivity is the greatest. If a eutectic or bonding layer is used, the exposed ends of the nano-structures would protrude into this layer, and would be allowed to conform to the opposing surface when the eutectic or bonding layer is fluid, as would occur prior to bonding the two surfaces. The expected gap dimension 1006 depends on the surface flatness of the circuit, silicon die and of the planarized micro-cooler surface. The RMS value of the surface asperity is believed to lie in the range of 0.2 um to 3 um with preferred values being at the lower end of the range.

The various embodiments described above should be considered as merely illustrative of the present invention. They are not intended to be exhaustive or to limit the invention to the forms disclosed. Those skilled in the art will readily appreciate that still other variations and modifications may be practiced without departing from the general spirit of the invention set forth herein. Therefore, it is intended that the present invention be defined by the claims that follow.

What is claimed is:

1. A micro-cooler device structure comprising:
   a heat sink body having a heat sink surface;
   a plurality of individually separated, rod like nano-structures for transferring thermal energy from a surface of at least one integrated circuit chip to said heat sink surface, said plurality of individually separated, rod-like nano-structures being disposed between said heat sink surface and said surface of at least one integrated circuit chip; and,
   a thermally conductive metallic material disposed within interstitial voids between said plurality of individually separated, rod-like nano-structures.

2. A micro-cooler device as recited in claim 1, wherein said plurality of individually separated, rod-like nano-structures are multi-walled carbon nanotubes.

3. A micro-cooler device as recited in claim 2, wherein said multi-walled carbon nano-tubes are oriented substantially perpendicular to said surface of at least one integrated circuit chip.

4. A micro-cooler device as recited in claim 2, wherein said plurality of individually separated, rod-like nano-structures have a coverage density between 15 and 40 percent.

5. A micro-cooler device as recited in claim 2, wherein said plurality of individually separated, rod-like nano-structures have a coverage density between 25 and 40 percent.

6. A micro-cooler device as recited in claim 1, wherein said plurality of individually separated, rod-like nano-structures are metallic nano-wires.

7. A micro-cooler device as recited in claim 6, wherein said metallic nano-wires are oriented substantially perpendicular to said surface of at least one integrated circuit chip.

8. A micro-cooler device as recited in claim 1, wherein said thermally conductive material comprises copper.

9. A micro-cooler device as recited in claim 1, wherein said thermally conductive material comprises alloys of copper.

10. A micro-cooler device as recited in claim 1, wherein said thermally conductive material comprises silver.

11. A micro-cooler device as recited in claim 1, wherein said thermally conductive material comprises aluminum.

12. A micro-cooler device as recited in claim 1, wherein said heat sink body is cooled by fins.

13. A micro-cooler device as recited in claim 1, wherein said heat sink body is cooled by a liquid flowing through passages fashioned therein.

14. A method for fabricating a micro-cooler device, comprising:
    fashioning a heat spreading cavity in a mounting surface of a heat sink body;
    growing individually separated, rod-like nano-structures within said cavity; and,
    depositing a thermally conductive material in interstitial voids between said rod-like nano-structures.

15. A method for fabricating a micro-cooler device as recited in claim 14, wherein said rod-like nano-structures are multi-walled carbon nano-tubes.

16. A method for fabricating a micro-cooler device as recited in claim 14, wherein said rod-like nano-structures are metallic nano-wires.

17. A method for fabricating a micro-cooler device as recited in claim 15, wherein said rod-like nano-structures have a coverage density between 15 and 40 percent.

18. A method for fabricating a micro-cooler device as recited in claim 15, wherein said rod-like nano-structures have a coverage density between 25 and 40 percent.

19. A method for fabricating a micro-cooler device as recited in claim 14, wherein said thermally conductive material comprises copper.

20. A method for fabricating a micro-cooler device as recited in claim 14, wherein said thermally conductive material comprises aluminum.

21. A method for fabricating a micro-cooler device as recited in claim 14, wherein said thermally conductive material comprises silver.

22. A method for fabricating a micro-cooler device as recited in claim 14, wherein said rod-like nano-structures are individually separated, and oriented substantially perpendicular to said mounting surface of said heat sink body.

23. A method for fabricating a micro-cooler device as recited in claim 22, further comprising: planarizing ends of said rod-like nano-structures such that said rod-like nano-structures extend beyond a planarized surface of said thermally conductive material.

24. A method for fabricating a micro-cooler device as recited in claim 23, further comprising: depositing a bonding layer over the ends of said rod-like nano-structures.

* * * * *